United States Patent [19]
Kawakami et al.

[11] Patent Number: 5,966,200
[45] Date of Patent: Oct. 12, 1999

[54] CHARGED PARTICLE BEAM EXPOSURE APPARATUS

[75] Inventors: Kenichi Kawakami; Tatsuro Ohkawa; Kazushi Ishida; Akiyoshi Tsuda, all of Tokyo, Japan

[73] Assignees: Fujuitsu Limited, Kawasaki; Advantest Corporation, Tokyo, both of Japan

[21] Appl. No.: 08/948,478

[22] Filed: Oct. 10, 1997

[30]        Foreign Application Priority Data

Apr. 10, 1997 [JP] Japan .................................. 9-092247

[51] Int. Cl.⁶ .......................... G03B 27/42; G01B 11/00; G01N 21/00
[52] U.S. Cl. .......................... 355/53; 356/401; 250/443.1
[58] Field of Search ............... 250/491.1, 492.2; 355/67, 53, 51; 353/41, 46, 30

[56]             References Cited

U.S. PATENT DOCUMENTS

| | | |
|---|---|---|
| 4,063,103 | 12/1977 | Sumi . |
| 4,119,854 | 10/1978 | Tanaka et al. . |
| 4,814,625 | 3/1989 | Yabu . |
| 4,891,526 | 1/1990 | Reeds . |
| 4,943,730 | 7/1990 | Takemura et al. . |
| 5,325,180 | 6/1994 | Chappelo .................................. 356/401 |
| 5,334,846 | 8/1994 | Nakano et al. ...................... 250/492.2 |
| 5,831,270 | 11/1998 | Nakasuji ................................. 250/396 |

FOREIGN PATENT DOCUMENTS

| | | |
|---|---|---|
| 0 183 125 | 6/1986 | European Pat. Off. . |
| 96/00978 | 1/1996 | WIPO . |

OTHER PUBLICATIONS

Patent Abstracts of Japan, vol. 012, No. 162, May 17, 1988 and JP 62–273722, NEC Corp., Nov. 27, 1987.
Patent Abstracts of Japan, vol. 007, No. 004, Jan. 8, 1983 and JP 57–162431, Nippon Denshi Kabushiki Kaisha, Oct. 6, 1982.
Patent Abstracts of Japan, vol. 006, No. 128, Jul. 14, 1982 and JP 57–054319, Fujitsu Ltd., Mar. 31, 1982.

*Primary Examiner*—Scott J. Sugarman
*Assistant Examiner*—Timothy J Thompson
*Attorney, Agent, or Firm*—Nikaido, Marmelstein, Murray & Oram LLP

[57]            ABSTRACT

The present invention is a charged particle beam exposure apparatus comprising: a column portion in which an optical system for a charged particle beam is disposed; a chamber to be coupled with the column portion; a movable sample stage located in the chamber for mounting a sample thereon; and a stage position measurement device, having an optical path for measurement, along which a laser beam having a predetermined frequency is projected and is reflected by reflection means provided on the sample stage, and an optical path for reference, which in length almost equals a distance between a starting point of the optical path for measurement and the origin of the optical system in the column portion and for which the length is increased at a rate substantially consistent with a thermal expansion coefficient as material of the chamber is expanded, for measuring a change in position of the sample stage by employing a laser optical signal for measurement, which passes along the optical path for measurement, and a reference laser signal, which passes along the optical path for reference.

4 Claims, 5 Drawing Sheets

CHARGED PARTICLE BEAM EXPOSURE APPARATUS

BACKGROUND OF THE INVENTION

1. Field of the Invention

The present invention relates to an apparatus using a charged particle beam, such as an electron beam or an ion beam, and in particular to an improvement for a stage position measurement device for detecting the position of a movable stage on which a sample to be exposed is mounted.

2. Related Arts

Since an exposure apparatus using a charged particle beam can perform an exposure at an accuracy on the order of sub-microns, it has drawn attention as a next generation LSI exposure apparatus. In this charged particle beam exposure apparatus, a beam emitted by a beam generation gun is formed into a desired shape when it passes through a predetermined transmission mask, and the shaped beam is deflected to irradiate a desired location on the surface of a sample. Since the range within which the beam is deflected is specifically limited, a stage on which the wafer is mounted is so provided that it can be moved horizontally.

The deflection of a beam is performed by an optical system comprising a beam gun, a deflector, an optical lens, etc. The stage on which the wafer is mounted is located in a chamber to which is attached a column portion in which the optical system is disposed. Therefore, when the stage is moved, it is necessary for the relative positions of the stage and the origin of the optical system to be accurately detected. The distance by which the beam is deflected from the origin of the optical system is calculated based on the relative positions.

A conventional, common stage position measurement device employs, for example, the heterodyne measurement principle. That is, two laser beams having frequencies slightly offset from each other are projected onto a sample stage, and a phase difference between the laser beam reflected by the stage and the reference laser beam that follows an optical path for reference is measured to acquire a displacement distance for the position of the stage. By the application of this principle, it is possible to measure the displacement distance for the position of the stage very accurately.

However, as the external temperature changes, so that the temperature in a clean room wherein the exposure apparatus is installed also changes, a chamber incorporating the stage expands or shrinks at a rate consistent with a thermal expansion coefficient. Accordingly, the distance from the internal wall of the chamber to the origin of the optical system in the column portion, which is normally located in the center of the chamber, is increased or reduced.

Under these circumstances, however, the above described stage position measurement device, which employs a laser interferometer, outputs the displacement distance for the position of the stage without taking into account the fact that the length of an optical path for measurement, along which a beam is projected from the internal wall of the chamber to the stage and is reflected by the stage, is extended or reduced as a consequence of the temperature change. As a result, an incorrect measurement is acquired for the relative distance between the origin of the optical system and the position of the stage.

Such an inaccurate measurement result causes the position irradiated by a beam to be shifted away from a correct location, and causes an exposure failure. The above problem can, in principle, be resolved by providing an expansion or a reduction value corresponding to a temperature change as a compensatory value for the distance a beam is displaced. In reality, however, it is difficult to detect a displacement distance that is attributable to thermal expansion, and since an unwanted compensatory value due to noise could be provided for the displacement distance, the above resolution is not appropriate. Further, a method for limiting temperature changes in a chamber requires the use of a large apparatus, and in actuality, it is difficult to accurately maintain a specific temperature.

SUMMARY OF THE INVENTION

It is, therefore, one object of the present invention to provide a charged particle beam exposure apparatus that includes a stage position measurement device, for accurately measuring a distance by which a stage is displaced from the origin of an optical system, even if a chamber expands or shrinks as a consequence of a temperature change.

To achieve the above object, according to one aspect of the present invention, a charged particle beam exposure apparatus comprises:

a column portion in which an optical system for a charged particle beam is disposed;

a chamber to be coupled with the column portion;

a movable sample stage located in the chamber for mounting a sample thereon; and a stage position measurement device, having an optical path for measurement, along which a laser beam having a predetermined frequency is projected and is reflected by reflection means provided on the sample stage, and an optical path for reference, which in length almost equals a distance between a starting point of the optical path for measurement and the origin of the optical system in the column portion and for which the length is increased at a rate substantially consistent with a thermal expansion coefficient as material of the chamber is expanded, for measuring a change in position of the sample stage by employing a laser optical signal for measurement, which passes along the optical path for measurement, and a reference laser signal, which passes along the optical path for reference.

More specifically, the charged particle beam exposure apparatus further comprises, at the least, reference optical path reflection means attached to an internal wall of the chamber to constitute the optical path for reference.

According to the present invention, the length of the optical path for reference is set equal to the distance from the starting point of the optical path for measurement to the origin of the optical system. When the distance to the origin is also extended or reduced by a change in temperature, accordingly, the length of the optical path for reference is also extended or reduced. Therefore, when the length of the optical path for reference is subtracted from the length of the optical path for measurement which corresponds to the distance to the position of the stage, the displacement distance of the stage relative to the origin, which is not affected by expansion or shrinkage due to a change in temperature, can be acquired.

In addition, to achieve the above object, according to anther aspect of the present invention, a charged particle beam exposure apparatus comprises:

a column portion in which an optical system for a charged particle beam is disposed;

a chamber to be coupled with the column portion;

a movable sample stage located in the chamber for mounting a sample thereon; and a stage position measurement device, having an optical path for measurement, along which a laser beam having a predetermined frequency is projected and is reflected by reflection means provided on the sample stage, and an optical path for reference, which in length is almost N times a distance between a starting point of the optical path for measurement to the origin of the optical system in the column portion and for which the length is increased at almost 1/N times an expansion rate at which the chamber is expanded, for measuring a change in a position of the sample stage by employing a laser optical signal for measurement, which passes along the optical path for measurement, and a reference laser signal, which passes along the optical path for reference.

According to this invention, the length of the optical path for reference does not necessarily equal the distance to the origin. Even when the length of the optical path for reference is N times the distance to the origin and is extended or reduced at 1/N the rate at which the chamber is expanded or shrunk, errors in the displacement of a stage attributable to temperature changes can be eliminated.

DETAILED DESCRIPTION OF THE PREFERRED EMBODIMENTS

The preferred embodiments of the present invention will now be described while referring to the accompanying drawings. The technical scope of the present invention is not limited to these embodiments, however, and the present invention can be applied for any charged particle beam exposure apparatus. The explanation of the embodiments will be given while employing an electron beam exposure apparatus as an example.

Figure 1:
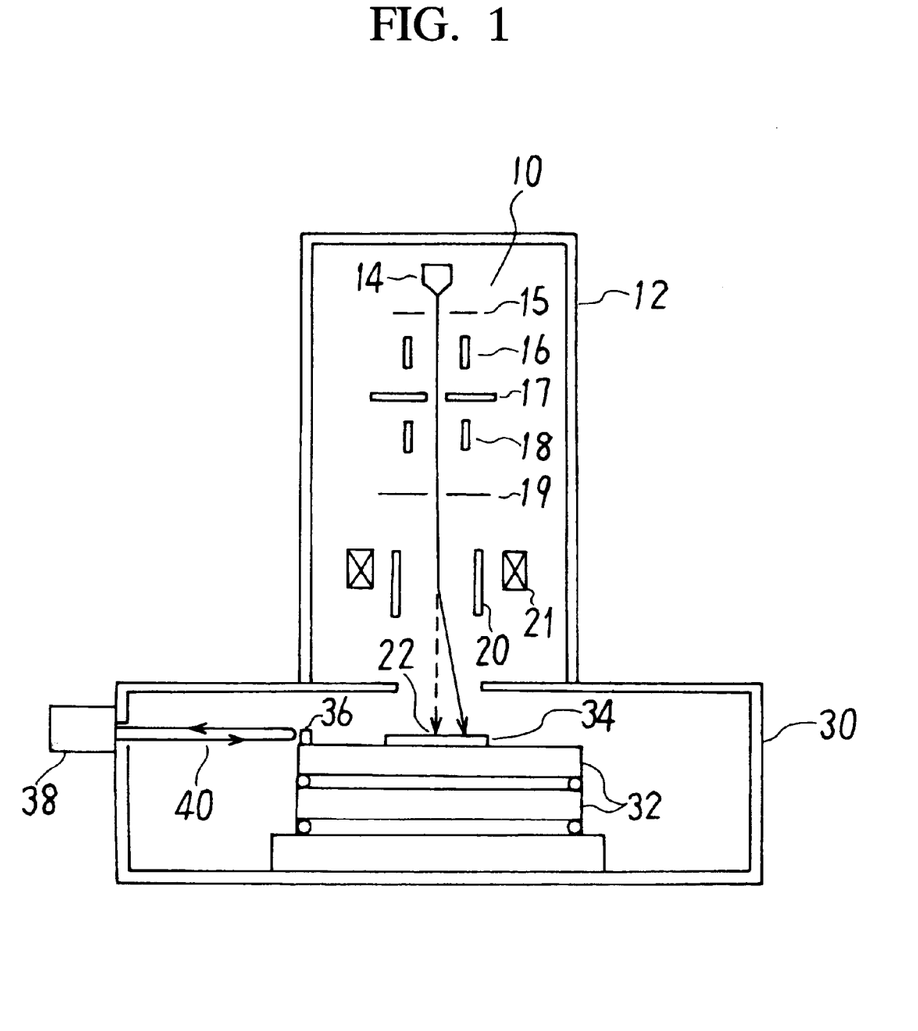
FIG. 1 is a diagram illustrating the general arrangement of an electron beam exposure apparatus in which is provided a stage position measurement device according to the present invention.

FIG. 1 is a diagram illustrating the general arrangement of an electron beam exposure apparatus in which is provided a stage position measurement device according to the present invention. A column portion 12 in which an optical system 10 for an electron beam is disposed is attached to a chamber 30. A vacuum is maintained inside the chamber 30, and a stage 32 on which is mounted a wafer 34, a sample to be exposed, is disposed in the chamber 20. The stage 32 is so provided in the chamber that it is movable in direction X and direction Y, and is driven in either direction by a motor (not shown). A stage position detector is also provided to detect the distance the stage 32 has moved. Provided for the stage position detector is an optical path 40 for measurement, which is formed between a laser interferometer 38 and a reflection mirror 36 that is attached to the stage 32, and an optical path for reference (not shown).

The optical system 10 in the column portion 12 includes, for example, an electron gun 14 for generating an electron beam; a first transmission mask 15 for shaping an electron beam; a second transmission mask 17 and a mask deflector 16 for deflecting the electron beam to a desired location on the second transmission mask 17; a blanking deflector 18; a round aperture 19, which serves as a diagram; a main deflector 21; and a sub-deflector 20. In addition, various types of beam lenses and compensation coils are included. The electron beam that is formed in a predetermined shape is deflected by the main deflector 21 and the sub-deflector 20, and is projected onto a desired location on the wafer 34. The irradiation path of the electron beam that is not deflected is indicated by the broken line, and a point 22 serves as the origin of the optical system 10.

With the thus arranged electron beam exposure apparatus, the main deflector 21 and the sub-deflector 20 limit the range within which the electron beam can be deflected, and can not cover the entire area of a wafer 34 having a large diameter. Therefore, a stage drive motor (not shown) is driven by a stage drive signal transmitted from an exposure controller to move the stage 32. At this time, the stage position detector feeds back to a servo-controller for the stage 32 a displacement distance associated with the movement of the stage 32, so that the stage 32 is moved a distance equivalent to the desired displacement.

The distance the stage 32 has been moved from the origin 22 of the electron beam, and an exposure position for the wafer 34 are employed to calculate the amount of deflection for the electron beam, and the deflection amount is transmitted to the deflectors 21 and 22. As a result, unless the displacement distance of the stage 32 is accurately measured, an exposure failure would occur.

Figure 6:
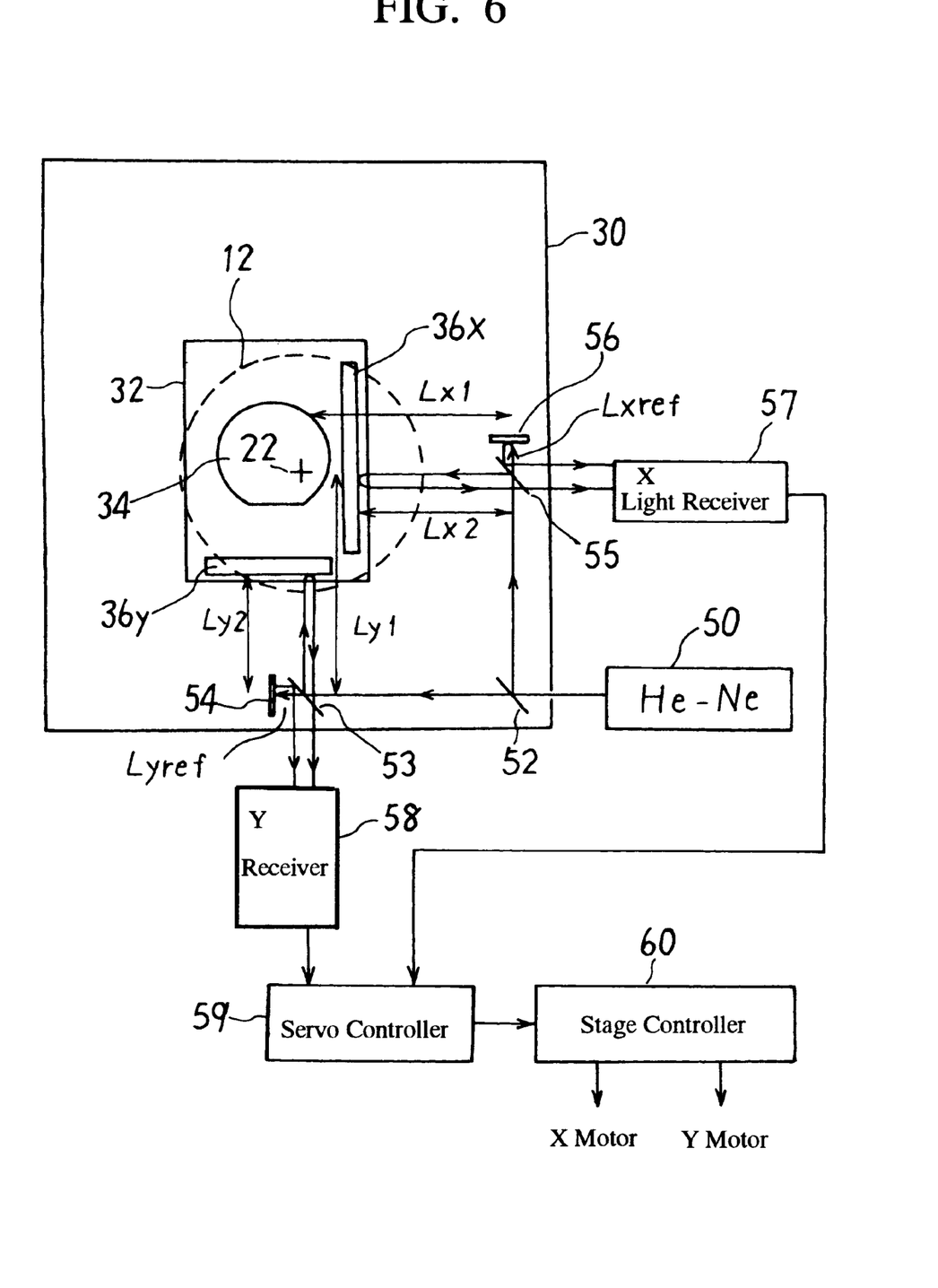
FIG. 6 is a diagram illustrating a general stage position measurement mechanism.

FIG. 6 is a diagram illustrating the general stage position measurement mechanism. The wafer 34 is mounted on the stage 32 located in the chamber 30. A reflection mirror 36X for direction X and a reflection mirror 36y for direction Y are attached to the stage 32. The device for measuring the position of the stage 32 measures a displacement distance in direction X and a displacement distance in direction Y.

A laser source 50 has, for example, a He—Ne gas laser generator, and generally projects two laser beams having frequencies $f_1$ and $f_2$, which slightly differ from each other. A laser beam is therefore a beat signal having a frequency of $f_1-f_2$. The frequency of a beat signal is, for example, several MHz. A laser beam projected by the common light source 50 is split into a horizontal laser beam and a vertically rising laser beam by a half mirror 52, and the split laser beams are used respectively for directional measurement Y and directional measurement X. The vertically rising laser beam is reflected in direction X (the horizontal direction in FIG. 6) by a half mirror 55, reflected by the X directional reflection mirror 36x attached to the stage 32, and is received by an X light receiver 57. The optical path of this laser beam is defined as an optical path for measurement. The laser beam reflected by the half mirror 55 is also reflected by a reflection mirror 56 for an optical path for reference, and is received from the half mirror 55 by the X light receiver 57. This optical path is defined as an optical path for reference.

The phase of the beat signal that is passed along the optical path for measurement and received, differs from the phase of the beat signal that is passed along the optical path for reference and received because of a difference in the lengths of the paths. By detecting a phase difference, the displacement of optical path for measurement Lx2 can be measured. The measurement principle for optical path Ly2 for measurement is the same as the above. A displacement of the stage in direction Y can be measured by employing a difference in the phases of a laser beam, which passes along an optical path for measurement from a half mirror 53 to a Y directional reflection mirror 36y, to the half mirror 53 and to a Y light receiver 58, and of a laser beam, which passes along an optical path for reference and is reflected by a reflection mirror 54.

Therefore, the position of the stage 32 relative to the origin 22 of the optical system 10 can be detected by referring to the changes in the lengths of the optical paths for measurement Lx2 and Ly2.

When distances Lx1 and Ly1 are constants that extend from the starting points of the optical paths for measurement Lx2 and Ly2, which are near the internal wall of the chamber 30, to the origin 22 of the optical system 10 in the column portion 12, servo-control for the stage shifting is performed to set the distances Lx2 and Ly2 to predetermined values, so that the position of the stage 32 relative to the origin 22 can be detected, and the stage 32 can be shifted to that position.

If the chamber 30 itself shrinks as a consequence of a temperature change, however, the distances Lx1 and Ly1 are accordingly reduced. Thus, even when the optical paths for measurement Lx2 and Ly2 are controlled to have predetermined values, the stage 32 would be shifted to an incorrect position relative to the origin 22 of the optical system 10, or the position of the stage 32 would be incorrectly detected.

Figure 2:
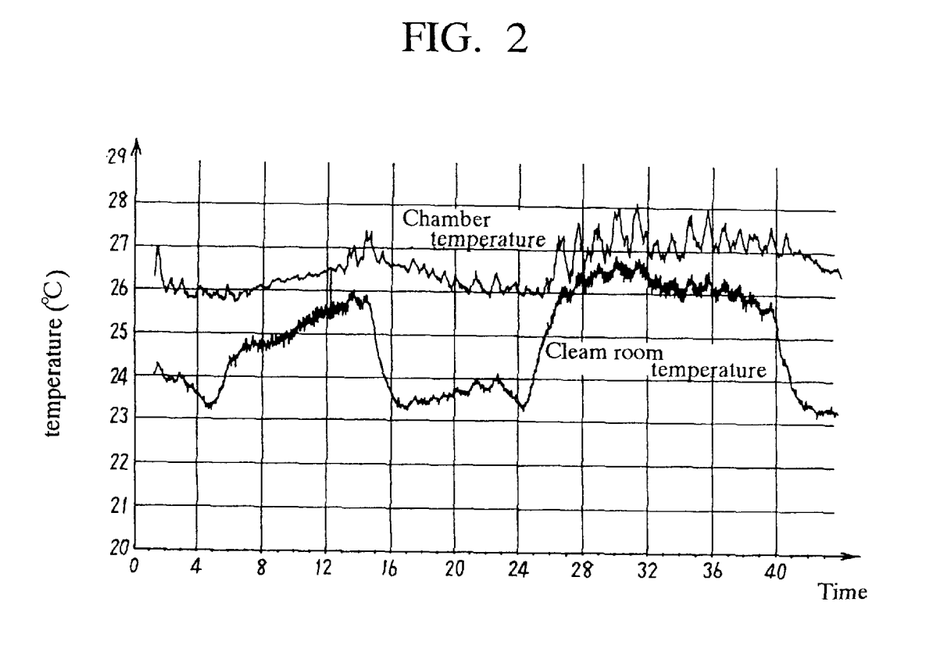
FIG. 2 is a graph showing an example relationship for a temperature in a clean room, in which the exposure apparatus is installed, and a temperature in a chamber.

FIG. 2 is a graph showing an example relationship between the temperature in a clean room in which the exposure apparatus is installed and the temperature of the chamber 30. In the graph, the horizontal axis represents time and the vertical axis represents temperature. As the temperature in the clean room changes, the temperature in the chamber 30 fluctuates.

Figure 3:
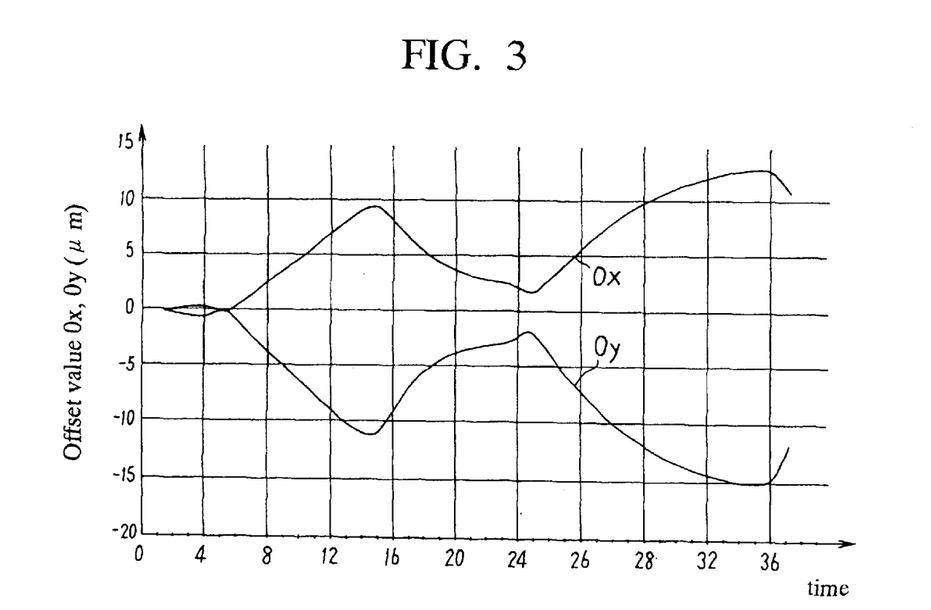
FIG. 3 is a graph showing an offset drift distance for an electron beam.

FIG. 3 is a graph showing the offset drift distance for an electron beam detected in association with the change in temperature in FIG. 2. The horizontal axis represents the time which corresponds to the horizontal axis in FIG. 2, while the vertical axis represents an offset distance for the movement of the electron beam to a position offset from the ideal position. As is shown in FIG. 3, offset values Ox and Oy fluctuate greatly in accordance with temperature changes in the chamber 30.

More specifically, as is described above, since the chamber 30 shrinks as a consequence of temperature changes, and the distances Lx1 and Ly1 are reduced, the servo-controller for controlling the stage shift controls the distances from the starting points of the optical paths for measurement to the reflection mirrors 36x and 36y on the stage, so that they are set to predetermined values without being affected by the temperature changes. As a result, the stage 32 can be inaccurately positioned relative to the origin 22 of the optical system 120.

Figure 4:
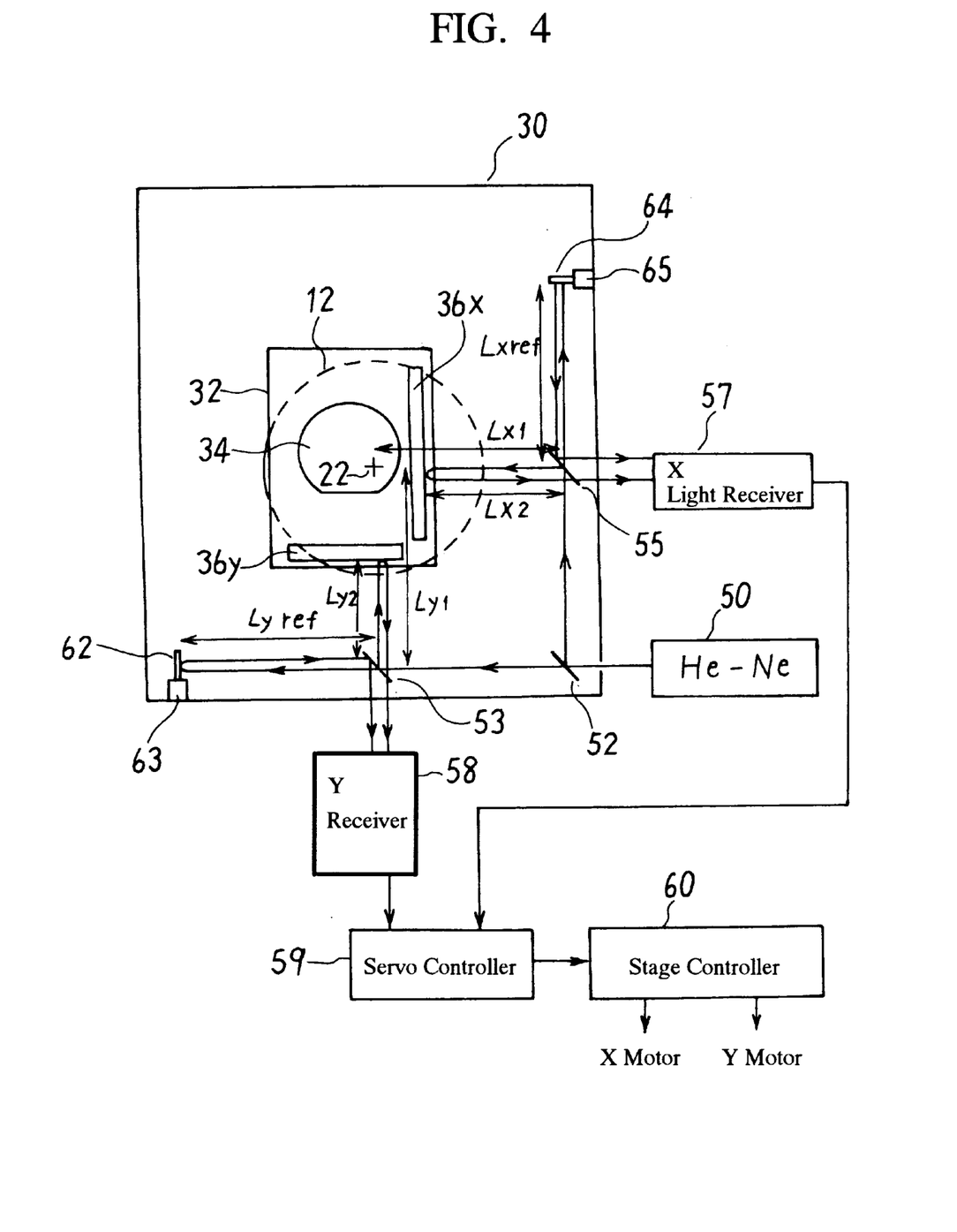
FIG. 4 is a diagram for explaining a stage position detection mechanism according to one embodiment of the present invention.

FIG. 4 is a diagram for explaining a stage position detection mechanism according to one embodiment of the present invention. In this embodiment, the lengths of the optical paths for reference Lxref and Lyref are set so that they are substantially equal to the lengths of the distances Lx1 and Ly1, which extend from the starting points of the optical paths for measurement Lx2 and Ly2 to the origin 22, and the lengths of the optical paths for reference Lxref and Lyref are expanded or reduced as a consequence of a temperature change in the chamber 30 at a rate consistent with the thermal expansion coefficient employed for the distances Lx1 and Ly1. The phase of a beat signal for a laser beam, which is passed along the optical paths for measurement Lx2 and Ly2, is changed as the stage 32 is moved, and similarly, the phase of a beat signal for a laser beam, which is passed along the optical paths for reference Lxref and Lyref changes as the chamber 30 expands or shrinks. As a result, differences or phase differences between the optical paths for measurement Lx2 and Ly2 and the optical paths for reference Lxref and Lyref are detected, so that the stage 32 can always be accurately positioned relative to the origin 22, or the accurate position of the stage 32 can be detected.

As is shown in FIG. 4, reflection mirrors 62 and 64, constituting the optical path for reference, are attached respectively to support members 63 and 65 fixed to the internal wall of the chamber 30. Generally, the chamber 30 is made, for example, of aluminum, and expands or shrinks greatly due to a temperature change, while the stage 30 is made of a material, such as silicone, having a small thermal expansion coefficient, and expands or shrinks little due to a temperature change.

In accordance with positional information for the stage 32 that is acquired by the X light receiver 57 and the Y light receiver 58, a servo controller 59 permits a stage driver 60 to drive an X directional driving motor and a Y directional driving motor. That is, closed servo control is performed.

In this embodiment, the length of the optical path for reference is so set that it equals the distance from the starting point of the optical path for measurement to the origin 22 of the optical system 10, and the reflection mirrors 62 and 64 are fixed to the internal wall of the chamber 30. Thus, the length of the optical path for reference is expanded or reduced by an amount equivalent to an expansion or a reduction in the distances Lx1 and Ly1 that occurs as a result of a temperature change in the chamber 30. Therefore, a difference in the phases of the optical path for reference and the measurement optical path, or a difference in their distances, is employed so that the position of the stage 32 relative to the origin 22 of the optical system 10 is not affected by an expansion or a reduction due to a temperature change in the chamber 30.

Figure 5:
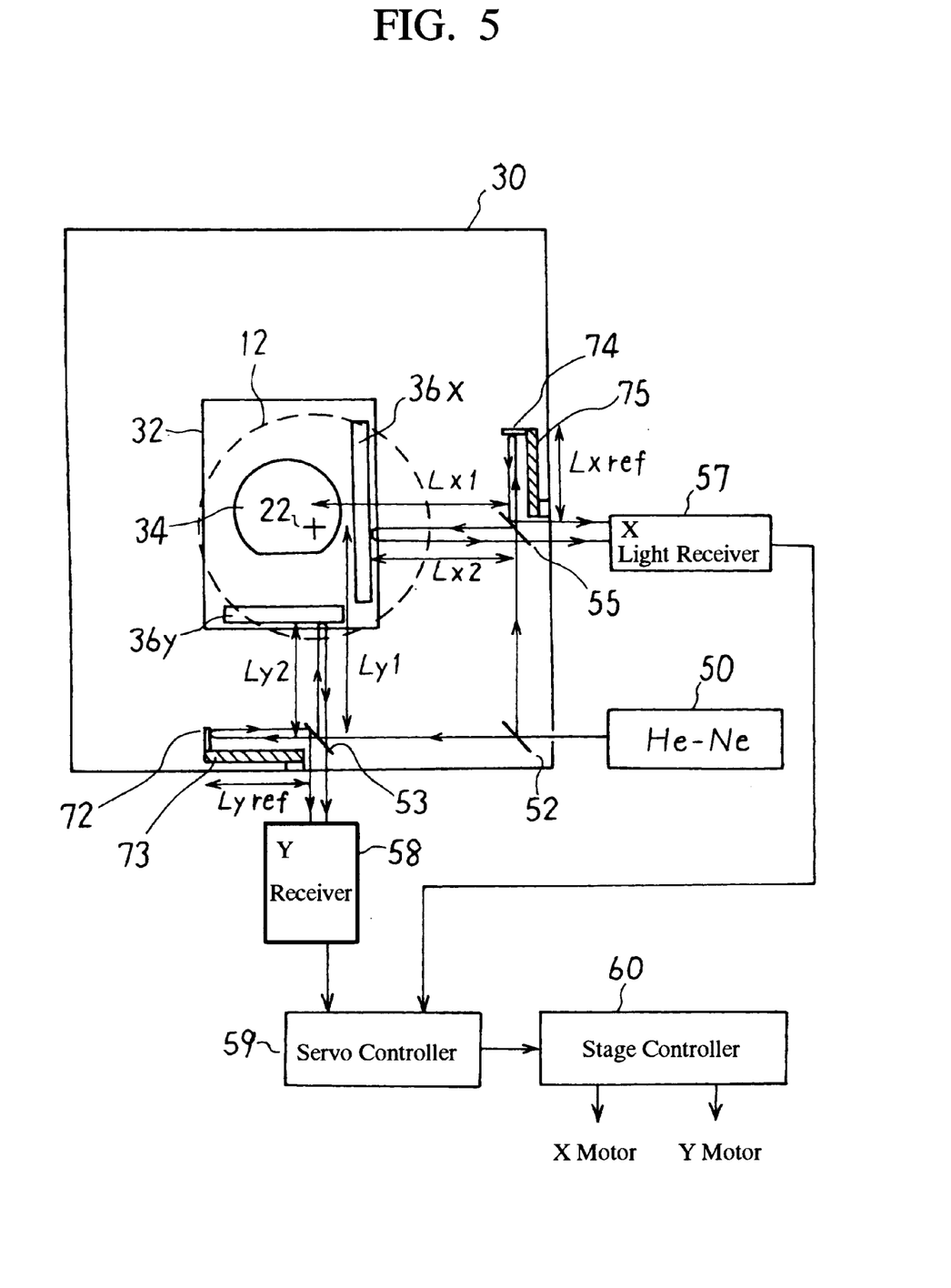
FIG. 5 is a diagram for explaining a stage position detection mechanism according to another embodiment of the present invention.

FIG. 5 is a diagram for explaining a stage position detection mechanism according to another embodiment of the present invention. In this embodiment, the lengths of optical paths for reference Lxref and Lyref do not equal the distances Lx1 and Ly1, but are shorter by N times (N<1), for example. Reflection mirrors 72 and 74, which form the optical paths for reference, are attached respectively to support members 73 and 75, which are made of a material having 1/N times the thermal expansion coefficient of the material used for a chamber 30. Thus, the expansion or reduction values of the distances Lx1 and Ly1 equal the expansion or reduction values of the optical paths for reference Lxref and Lyref. And as a result, as well as in the embodiment in FIG. 4, it is possible to eliminate the influence imposed by the expanding or shrinking of the chamber 30, which is caused by a temperature change.

In addition, as the optical paths for reference Lxref and Lyref can be substantially shorter, they can be held in a narrow chamber 30. If there is enough storage space and if the type of material used for the support members 73 and 75 is limited, the lengths of the optical paths for reference Lxref and Lyref may be extended so that they are longer than the distances Lx1 and Ly1. The other portions are the same as those in FIG. 4.

As is described above, according to the present invention, the rate at which the length of the optical path for reference is expanded or reduced is the same as the rate of expanding or shrinkage of the chamber 30 that is caused by a change in temperature. Thus, in accordance with the differences between the optical paths for measurement and the optical paths for reference, measurements for the position of the stage can be obtained without their being affected by the expanding or shrinkage which occurs as a result of a change in temperature. As a result, an electron beam can be accurately deflected to irradiate a correct location on the surface of a sample, such as a wafer.

What is claimed is:

1. A charged particle beam exposure apparatus comprising:

a column portion in which an optical system for a charged particle beam is disposed;

a chamber to be coupled with said column portion;

a movable sample stage located in said chamber for mounting a sample thereon; and a stage position measurement device, having an optical path for measurement, along which a laser beam having a predetermined frequency is projected and is reflected by reflection means provided on said sample stage, and an optical path for reference, which in length almost equals a distance between a starting point of said optical path for measurement and the origin of said optical system in said column portion and for which the length is increased at a rate substantially consistent with an expansion coefficient as material of said chamber is expanded, for measuring a change in position of said sample stage by employing a laser optical signal for measurement, which passes along said optical path for measurement, and a reference laser signal, which passes along said optical path for reference.

2. A charged particle beam exposure apparatus according to claim 1, further comprising, at the least, reference optical path reflection means attached to an internal wall of said chamber to constitute said optical path for reference.

3. A charged particle beam exposure apparatus comprising:

a column portion in which an optical system for a charged particle beam is disposed;

a chamber to be coupled with said column portion;

a movable sample stage located in said chamber for mounting a sample thereon; and a stage position measurement device, having an optical path for measurement, along which a laser beam having a predetermined frequency is projected and is reflected by reflection means provided on said sample stage, and an optical path for reference, which in length is almost $N$ times a distance between a starting point of said optical path for measurement to the origin of said optical system in said column portion and for which the length is increased at almost $1/N$ times an expansion rate at which said chamber is expanded, for measuring a change in a position of said sample stage by employing a laser optical signal for measurement, which passes along said optical path for measurement, and a reference laser signal, which passes along said optical path for reference.

4. A charged particle beam exposure apparatus according to claim 3, further comprising reference optical path reflection means constituting said optical path for reference, wherein said reference optical path reflection means is fixed to a distal end of a support member, which is fixed to an internal wall of said chamber at a starting point for said optical path for measurement and for which a thermal expansion coefficient is almost $1/N$ times that of said chamber.

* * * * *

UNITED STATES PATENT AND TRADEMARK OFFICE
CERTIFICATE OF CORRECTION

PATENT NO.  : 5,966,200
DATED       : October 12, 1999
INVENTOR(S) : Kenichi Kawakami, et al.

It is certified that error appears in the above-identified patent and that said Letters Patent is hereby corrected as shown below:

On the title page:

Item [73], please delete "Fujuitsu Limited", and insert therefor, -- Fujitsu Limited --

Signed and Sealed this

Twenty-sixth Day of December, 2000

Attest:

Q. TODD DICKINSON

Attesting Officer

Director of Patents and Trademarks